US008962414B1

United States Patent
Faul et al.

(10) Patent No.: US 8,962,414 B1
(45) Date of Patent: Feb. 24, 2015

(54) REDUCED SPACER THICKNESS IN SEMICONDUCTOR DEVICE FABRICATION

(71) Applicant: GLOBALFOUNDRIES Inc., Grand Cayman, KY (US)

(72) Inventors: Juergen Faul, Radebeul (DE); Frank Jakubowski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 6 days.

(21) Appl. No.: 13/954,530

(22) Filed: Jul. 30, 2013

(51) Int. Cl.
*H01L 21/8238* (2006.01)
*H01L 27/088* (2006.01)
*H01L 29/66* (2006.01)

(52) U.S. Cl.
CPC .......... *H01L 27/088* (2013.01); *H01L 29/6656* (2013.01)
USPC .................... 438/199; 438/230; 257/E21.632

(58) Field of Classification Search
USPC ................. 438/197, 199, 230, 231, 301, 302; 257/E21.632
See application file for complete search history.

(56) References Cited

U.S. PATENT DOCUMENTS

2011/0117712 A1 * 5/2011 Muralidhar et al. .......... 438/287

* cited by examiner

*Primary Examiner* — Hoai V Pham
(74) *Attorney, Agent, or Firm* — Amerson Law Firm, PLLC

(57) ABSTRACT

In aspects of the present disclosure, a reliable encapsulation of a gate dielectric is provided at very early stages during fabrication. In other aspects, a semiconductor device is provided wherein a reliable encapsulation of a gate dielectric material is maintained, the reliable encapsulation being present at early stages during fabrication. In embodiments, a semiconductor device having a plurality of gate structures is provided over a surface of a semiconductor substrate. Sidewall spacers are formed over the surface and adjacent to each of the plurality of gate structures, wherein the sidewall spacers cover sidewall surfaces of each of the plurality of gate structures. After performing an implantation sequence into the sidewall spacers using adjacent gate structures as implantations masks, shadowing lower portions of the sidewall spacers, an etching process is performed for removing implanted portions from the sidewall spacers, leaving lower shadowed portions of the sidewall spacer as shaped sidewall spacers.

14 Claims, 4 Drawing Sheets

REDUCED SPACER THICKNESS IN SEMICONDUCTOR DEVICE FABRICATION

BACKGROUND OF THE INVENTION

1. Field of the Invention

The present disclosure generally relates to semiconductor devices, and, more particularly, to devices having gate and channel lengths smaller than 35 nm and to fabricating according semiconductor devices.

2. Description of the Related Art

The majority of present-day integrated circuits (ICs) are implemented by using a plurality of interconnected field effect transistors (FETs), also called metal oxide semiconductor field effect transistors (MOSFETs) or simply MOS transistors. Typically, present-day integrated circuits are implemented by millions of MOS transistors which are formed on a semiconductor substrate with a given surface area.

Basically, MOS transistors act as electronic switching elements wherein a current through a channel region, formed between source and drain regions of a MOS transistor, is controlled by a gate electrode which is typically disposed over the channel region, independent from whether a PMOS transistor or an NMOS transistor is considered. Particularly, the conductivity state of a transistor is changed by a voltage applied to the gate electrode passing a so-called threshold voltage (Vt). In general, the threshold voltage depends non-trivially on the transistor's properties, such as size, material, etc.

However, as semiconductor devices and device features have become smaller in order to comply with requirements set by advanced integration densities, conventional fabrication techniques have been pushed to their limits, challenging their abilities to produce finely defined features at presently required scales. Consequently, developers are faced anew at each scale with problems and constraints imposed by scaling limitations which arise as semiconductor devices continue to decrease in size.

Typically, high-k gate dielectric materials are very sensitive to manufacturing environments, such as high temperatures, conventionally present during annealing sequences necessary for healing crystal damages caused by implantations and activation of implanted impurities, and cleaning and etching environments, which are, for example, present in various cleaning and etching processes applied at various stages during fabrication.

In conventional gate first processes in which a gate stack comprising a gate dielectric and a gate electrode material layer formed on the gate dielectric is implemented at an early stage of fabrication, particularly before formation of source and drain regions, a thick encapsulation spacer having a thickness of about 125 Å and, for example, consisting of silicon nitride is necessary to reliably encapsulate the gate dielectric. This is conventionally achieved by depositing a silicon nitride layer having a thickness of 45 Å in a molecular layer deposition (MLD) and a subsequent deposition of further 80 Å of silicon nitride material by a low pressure chemical vapor deposition (LPCVD) process or a rapid thermal chemical vapor deposition (RTCVD) process. Consequently after performing source/drain extension region implantation sequences for forming source/drain extension regions in alignment with the previously formed spacer encapsulation, extension regions are formed at more than 13 nm away from a channel region, wherein the channel region is disposed directly under the gate stack within the semiconductor substrate. It turned out that, in order to diffuse a sufficient amount of dopants towards the channel region under the spacer encapsulation, it is necessary to implant source/drain implantation species to a depth of about 20 nm into the semiconductor substrate such that, during a subsequent annealing process, a sufficient amount of dopants is driven sufficiently deep under the spacer forming a sufficiently small channel region under the gate stack.

However, in advanced semiconductor devices fabricated with ultra large scale integration (ULSI) techniques giving ultra-small gate lengths or channel lengths, it is required to implant source/drain extension dopants into a depth of about 10 nm, thus setting an upper constraint on a maximum spacer thickness for encapsulation spacers of about 5 nm, opposed to conventional spacer thickness of 13 nm which is required for reliable encapsulation of complex gate dielectric materials. Current propositions are directed to additionally increase the halo doses, which further leads to performance drawbacks for advanced semiconductor devices.

It is, therefore, desirable to provide a method which allows for reliably encapsulating gate dielectric materials at an early stage of fabrication and particularly before formation of source/drain extension regions without increasing a halo implantation dose and implantation depth of source/drain extension dopants. Furthermore, it is desirable to provide a semiconductor device having a reliably encapsulated gate dielectric, particularly at least improving, if not avoiding, at least some of the above-discussed problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention provides a method of forming a semiconductor device in advanced technologies, i.e., technologies with technology nodes smaller than 50 nm, more preferably smaller than 35 nm. In aspects of the invention, a reliable encapsulation of a gate dielectric is already present at very early stages during fabrication. In other aspects, a semiconductor device is provided wherein a reliable encapsulation of a gate dielectric material is maintained, the reliable encapsulation already being present at early stages during fabrication.

In one embodiment of the present disclosure, a method of forming a semiconductor device is provided which includes providing a plurality of gate structures over a surface of a semiconductor substrate, forming sidewall spacers over the surface and adjacent to each of the plurality of gate structures, the sidewall spacers covering sidewall surfaces of each of the plurality of gate structures, performing an implantation sequence into the sidewall spacers so as to form implanted portions in the sidewall spacers, and subsequently performing an etching process for removing the implanted portions from the sidewall spacers so as to form shaped sidewall spacers.

In another embodiment of the present disclosure, a method of forming a semiconductor device is provided which includes providing at least a first gate structure and a second gate structure over a surface of a semiconductor substrate, forming at least a first sidewall spacer over the surface and adjacent to the first gate structure and a second sidewall spacer over the surface and adjacent to the second gate structure, the at least first and second sidewall spacers covering sidewall surfaces of each of the first and second gate structures, performing a first implantation sequence into the at least first and second sidewall spacers so as to form implanted portions in the at least first and second sidewall spacers, performing an etching process for removing the implanted portions from the at least first and second sidewall spacers for forming at least first and second shaped sidewall spacers, performing a second implantation sequence for forming source and drain extension regions adjacent to each of the at least first and second gate structures in alignment with the shaped sidewall spacers, forming at least a third sidewall spacer over the first sidewall spacer and a fourth sidewall spacer over the second sidewall spacer, and performing a third implantation process for forming deep source and drain regions at two opposing sides of at least the first and second gate structures within the source and drain extension regions in alignment with the third and fourth sidewall spacers.

In a further embodiment of the present disclosure, a semiconductor device structure is provided which includes a first gate structure formed over a surface of a semiconductor substrate, a second gate structure formed over the surface, a first sidewall spacer formed adjacent to the first gate structure, the first sidewall spacer covering a portion of at least one sidewall of the first gate structure up to a height of substantially less than about 30 nm along a normal direction of the surface of the semiconductor substrate and the first sidewall spacer extending away from the first gate structure for substantially less than about 15 nm along a direction parallel to a normal direction of the covered sidewall portion, a second sidewall spacer formed adjacent to the second gate structure, the second sidewall spacer covering a portion of at least one sidewall of the second gate structure up to a height of substantially less than about 30 nm along a normal direction of the surface of the semiconductor substrate and the second sidewall spacer extending away from the second gate structure for substantially less than about 15 nm along a direction parallel to a normal direction of the covered sidewall portion, a third sidewall spacer formed adjacent to the first gate structure, the third sidewall spacer covering sidewalls of the first gate structure and the first sidewall spacer, and a fourth sidewall spacer formed adjacent to the second gate structure, the fourth sidewall spacer covering sidewalls of the second gate structure and the second sidewall spacer.

BRIEF DESCRIPTION OF THE DRAWINGS

The disclosure may be understood by reference to the following description taken in conjunction with the accompanying drawings, in which like reference numerals identify like elements, and in which.

Figure 1:
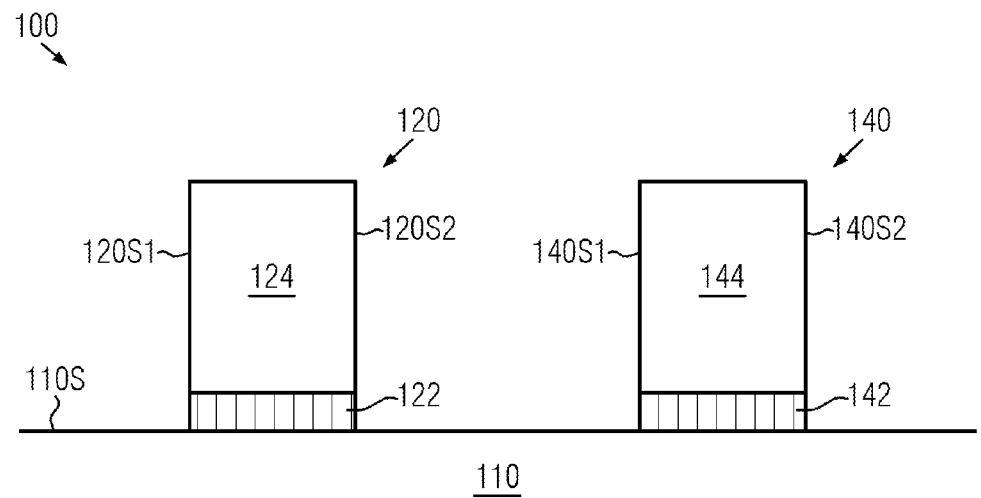
FIGS. 1-5 schematically illustrate in cross-sectional views a process flow according to illustrative embodiments of the present disclosure for fabricating a semiconductor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to semiconductor device structures and, particularly, to semiconductor devices such as metal oxide semiconductor devices or MOS devices. The person skilled in the art will appreciate that although the expression "MOS device" is used, no limitation to a metal-containing gate material and/or to an oxide-containing gate dielectric material is intended. Semiconductor devices of the present disclosure and particularly MOS devices as illustrated by means of some illustrative embodiments as described herein concern devices fabricated by using advanced technologies. Semiconductor devices and particularly MOS devices of the present disclosure are fabricated by technologies applied to approach technology nodes smaller than 100 nm, preferably smaller than 50 nm, more preferably smaller than 35 nm. The person skilled in the art will appreciate that the present disclosure suggests semiconductor devices, and particularly MOS devices, having gate structures such as gate stacks having a gate electrode material layer and a gate dielectric material layer with a length dimension smaller than 100 nm, preferably smaller than 50 nm, more preferably smaller than 35 nm. The present disclosure suggests providing methods of achieving reliable encapsulation of gate structures at very early stages of fabrication.

The person skilled in the art understands that MOS transistors may be fabricated as P-channel MOS transistors or PMOS transistors and as N-channel transistors or NMOS transistors, and both may be fabricated with or without mobility enhancing stressor features or strain-inducing features. The person skilled in the art understands that stress and strain may be described with regard to a tensile modulus. A circuit designer can mix and match device types, using PMOS and NMOS transistors, stressed and unstressed, to take advantage of the best characteristics of each device type as they best suit the circuit being designed.

In describing the following figures, semiconductor device structures and methods for forming a semiconductor device in accordance with various exemplary embodiments of the present disclosure will be illustrated. The described process steps, procedures and materials are to be considered only as exemplary embodiments designed to illustrate to one of ordinary skill in the art methods for practicing the invention. However, it is to be understood that the invention is not to be limited to these exemplary embodiments. Illustrated portions of semiconductor devices and semiconductor device structures may include only a single MOS structure, although those skilled in the art will recognize that actual implementations of integrated circuits may include a large number of such structures. Various steps in the manufacture of semiconductor devices and semiconductor device structures are well known and so, in the interests of brevity, many conventional steps will only be mentioned briefly herein, or will be omitted entirely without providing the well-known process details.

With regard to the accompanying FIGS. 1-5, methods and semiconductor device structures according to various illustrative embodiments of the present disclosure are now described in greater detail.

Referring to FIG. 1, a semiconductor device structure 100 is shown at a very early stage during fabrication. A semiconductor substrate 110 is provided, the semiconductor substrate comprising a semiconductor material which may be selected from silicon, germanium, silicon/germanium, silicon/carbon, silicon/germanium/carbon, gallium arsenide, indium arsenide, indium phosphate and other appropriate semiconductor materials. In preferred embodiments, the semiconductor material may be given by silicon. The person skilled in the art will appreciate that the semiconductor substrate 110 may be a single crystalline silicon layer having a surface orientation, i.e., a crystallographic orientation of the surface normal of a top surface of the semiconductor substrate 110, being one of a major crystallographic orientation. The semiconductor substrate 110 may be a bulk substrate, a semiconductor-on-insulator (SOI) substrate or a hybrid substrate. The semiconductor substrate 110 may further have a built-in stress which does not pose any limitation to the present disclosure. The semiconductor substrate 110 may be doped, such as having one or more well regions, or alternatively may be undoped at the stage shown in FIG. 1.

The semiconductor device structure 100 comprises a first gate structure 120 formed over a surface 110S of the semiconductor substrate 110 and a second gate structure 140 formed over the surface 110S. Although the first and second gate structures 120, 140 are illustrated in FIG. 1 as being formed adjacent to each other, the person skilled in the art will appreciate that no limitation of the present disclosure is intended and, in alternative embodiments or aspects of the present disclosure, the first and second gate structures 120, 140 may be formed spaced apart from each other such that one or more further gate structures and/or semiconductor devices are formed in between the first and second gate structures 120, 140.

The first gate structure 120 as shown in FIG. 1 represents a gate stack configuration formed by a gate dielectric layer 122 disposed over the surface 110S of the semiconductor substrate 110 and a gate electrode material layer 124 disposed over the gate dielectric layer 122. The first gate structure 120 illustrated in FIG. 1 has exposed sidewall surfaces 120S1 and 120S2 which are given in the illustration of FIG. 1 by opposing sidewall surfaces of the first gate structure 120. The person skilled in the art will appreciate that the sidewall surfaces 120S1 and 120S2 comprise sidewall surfaces of the gate electrode material layer 124 and the gate dielectric layer 122. The person skilled in the art will appreciate that, in some illustrative embodiments herein, the gate dielectric layer 122 may comprise at least one of one or more high-k dielectric materials, such as hafnium oxide, hafnium oxynitride and the like, and work function adjusting materials which may be provided by means of a plurality of sub-layers (not illustrated) of the gate dielectric layer 122. Although not explicitly illustrated in FIG. 1, the person skilled in the art will appreciate that a base layer of silicon oxide may be present in between the semiconductor substrate 110 and the gate dielectric layer 122, i.e., the base layer may be formed on the surface 110S of the semiconductor substrate 110, at least on a surface portion covered by the first gate structure 120. It is further possible that the semiconductor substrate 110 has a silicon/germanium channel formed close to the surface 110S of the semiconductor substrate 110 in case that a PMOS device is to be implemented.

The second gate structure 140 as shown in FIG. 1 represents a gate stack configuration formed by a gate dielectric layer 142 disposed over the surface 110S of the semiconductor substrate 110 and a gate electrode material layer 144 disposed over the gate dielectric layer 142. The second gate structure 140 illustrated in FIG. 1 has exposed sidewall surfaces 140S1 and 140S2 which are given in the illustration of FIG. 1 by opposing sidewall surfaces of the second gate structure 140. The person skilled in the art will appreciate that the sidewall surfaces 140S1 and 120S2 comprise sidewall surfaces of the gate electrode material layer 144 and the gate dielectric layer 142. The person skilled in the art will appreciate that, in some illustrative embodiments herein, the gate dielectric layer 142 may comprise at least one of one or more high-k dielectric materials, such as hafnium oxide, hafnium oxynitride and the like, and work function adjusting materials which may be provided by means of a plurality of sub-layers (not illustrated) of the gate dielectric layer 142. Although not explicitly illustrated in FIG. 1, the person skilled in the art will appreciate that a base layer of silicon oxide may be present in between the semiconductor substrate 110 and the gate dielectric layer 142, i.e., the base layer may be formed on the surface 110S of the semiconductor substrate 110, at least on a surface portion covered by the second gate structure 140. It is further possible that the semiconductor substrate 110 has a silicon/germanium channel formed close to the surface 110S of the semiconductor substrate 110 in case that a PMOS device is to be implemented.

The gate structures 120, 140 may be formed by conventional gate stack-forming methods such as, for example, depositing one or more gate dielectric material layer-forming materials on or over the semiconductor substrate 110, followed by further depositing a gate material on the deposited gate dielectric material layer-forming material. Subsequently, one or more gate stacks may be formed by performing conventional patterning techniques, such as forming a masking structure over the gate material and performing etching processes through the mask structure, followed by cleaning processes for removing the masking structure, leaving one or more gate stacks, such as the first and second gate structures 120, 140. The first and second gate structures 120, 140 may be formed simultaneously or consecutively. In some illustrative embodiments, the first gate structure 120 may implement an NMOS type device and the second gate structure 140 may implement a PMOS type device. Alternatively, the first and second gate structures 120, 140 may implement the same device type. The person skilled in the art will appreciate that the material composition of at least one of the layers 122, 142 and 124, 144 may be identical or different, depending on the intended application.

Figure 2A:
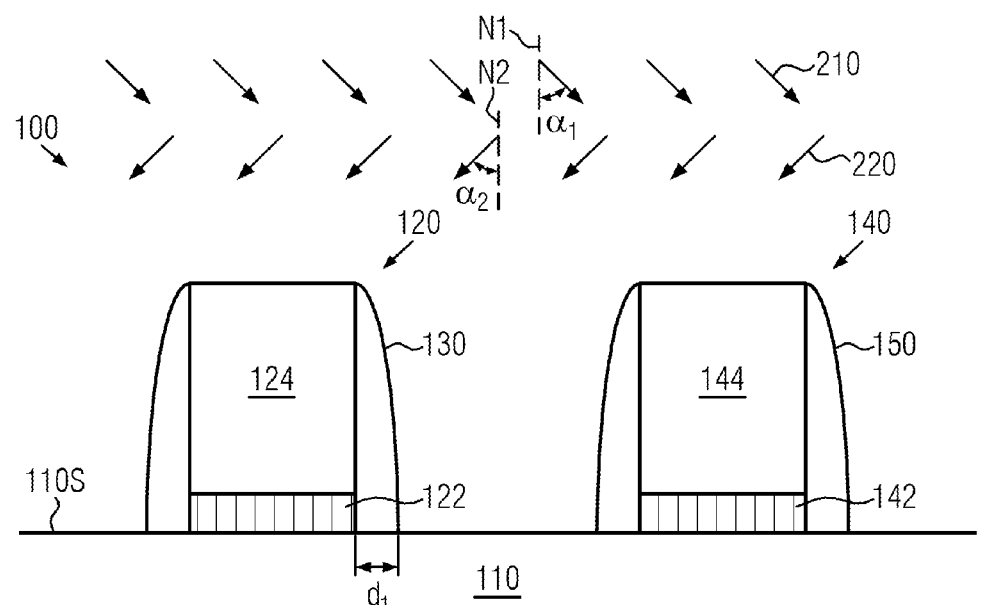

FIG. 2a schematically illustrates the semiconductor device structure 100 at an advanced stage during fabrication after having formed sidewall spacers 130 adjacent to the first gate structure 120 and sidewall spacers 150 adjacent to the second gate structure 140. The sidewall spacers 130, 150 cover respective sidewall surfaces (120S1, 120S2 and 140S1, 140S2 in FIG. 1). The sidewall spacers 130, 150 have a thickness which is schematically illustrated for sidewall spacers 130 by reference numeral $d_1$. In current complex semiconductor device structures at advanced technology nodes, the thickness $d_1$ may be about 13 nm or more. The person skilled in the art will appreciate that the thickness $d_1$ depends on requirements for reliably encapsulating the gate dielectric layer 122 and 142, respectively. For instance, when the gate dielectric layer 122 and the gate dielectric layer 142, respectively, comprise high-k dielectric materials, it is necessary to protect the sensitive gate dielectric during subsequent etching, cleaning and annealing processes. The person skilled in the art will appreciate that, provided the dimension of a gate structure extending in parallel to the thickness as indicated by double-arrow $d_1$ in FIG. 2a becoming very small, a reliable control of a channel region formed in the semiconductor substrate 110 underneath the gate stacks 120, 140 sets upper limits on possible thicknesses $d_1$ of sidewall spacers such as sidewall spacers 130.

It is proposed to perform an implantation process comprising implantation sequences 210 and 220 as schematically illustrated in FIG. 2a. The implantation sequences 210 and 220 are performed at tilt angles with respect to a normal direction of the surface 110S as indicated by broken lines N1 and N2 in FIG. 2a. Implantation sequence 210 is therefore applied at a tilt angle $\alpha_1$ relative to the normal direction N1 and implantation sequence 220 is applied at a tilt angle $\alpha_2$ relative to the normal direction N2. According to a first illustrative example herein, angles $\alpha_1$ and $\alpha_2$ are selected such that the absolute value of angle $\alpha_1$ is about equal to the absolute value of angle $\alpha_2$. The person skilled in the art will appreciate that, in some illustrative examples herein, angles $\alpha_1$ and $\alpha_2$ may be related by a factor of about $-1$. In accordance with a second illustrative example, the absolute value of a difference between absolute values of $\alpha_1$ and $\alpha_2$ may be substantially less than about 5 degrees. According to a third illustrative example herein, at least one of $\alpha_1$ and $\alpha_2$ may be greater than about 15 degrees and preferably greater than about 30 degrees. In accordance with a fourth illustrative example herein, $\alpha_1$ and $\alpha_2$ may have differing magnitudes. The person skilled in the art will appreciate that the afore-described illustrative examples may be combined, thus disclosing further illustrative examples which may be considered if appearing appropriate.

In illustrative embodiments herein, implantation species used in the implantation sequences 210, 220 may be provided by at least one of xenon, germanium, silicon, nitride, carbon and the like. The person skilled in the art will appreciate that an appropriate implantation species may be provided by comparably heavy species as compared to silicon. A preferred implantation species may be selected depending on the etch rate of the implanted material in comparison to material being not exposed to implantation of the implantation species.

Figure 2B:
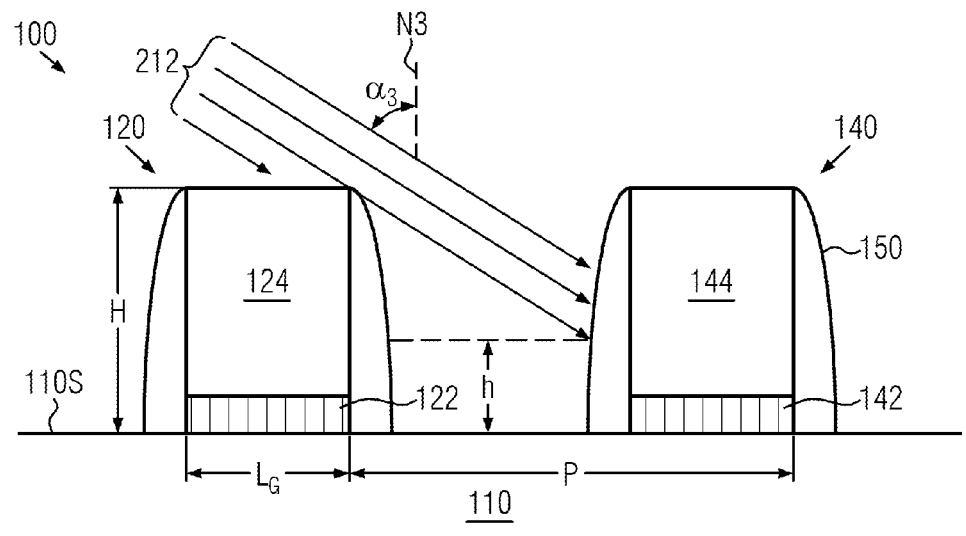

FIG. 2b schematically illustrates the semiconductor device structure 100 during the implantation sequence 210 as illustrated in FIG. 2a. Particularly, FIG. 2b illustrates a ray bundle 212 of implantation rays along which implanted species are implanted into the semiconductor device structure 100. The implantation rays of the ray bundle 212 are oriented relative to a normal direction N3 of the surface 110S as indicated by means of angle $\alpha_3$. It is understood that $\alpha_3$ may substantially correspond to angle $\alpha_1$ in FIG. 2a.

An illustrative geometry of the semiconductor device structure 100 will be described with regard to FIG. 2b. A height of the gate structures 120, 140 is indicated by an extension H. A pitch between two neighboring gate structures 120, 140 is indicated in FIG. 2b by an extension P. Given preselected values for the pitch P, the height H and the angle $\alpha_3$, a "shadowing height h" may be determined by the following relation: $(H-h) \times \tan(\alpha 3) = (P-L_G)$, wherein $L_G$ indicates a gate length as indicated in FIG. 2b (a thickness of the sidewall spacers is neglected; when considering the sidewall spacer, its thickness should be further removed from $P-L_G$). In other words, a lower portion of the sidewall spacer 150 of the second gate structure 140 is shadowed by the first gate structure 120. Particularly, portions of sidewall spacer 150 extending upwardly away from the broken line illustrated in FIG. 2b are exposed to the implantation sequence 210 (FIG. 2a), as indicated in FIG. 2b by the ray bundle 212, while portions of the sidewall spacer 150 lower than the broken line extending down to the surface 110S of the semiconductor substrate 110 are substantially not exposed to the ray bundle 212 as the adjacent first gate structure 120 shadows that lower portion of the sidewall spacer 150.

Figure 2C:
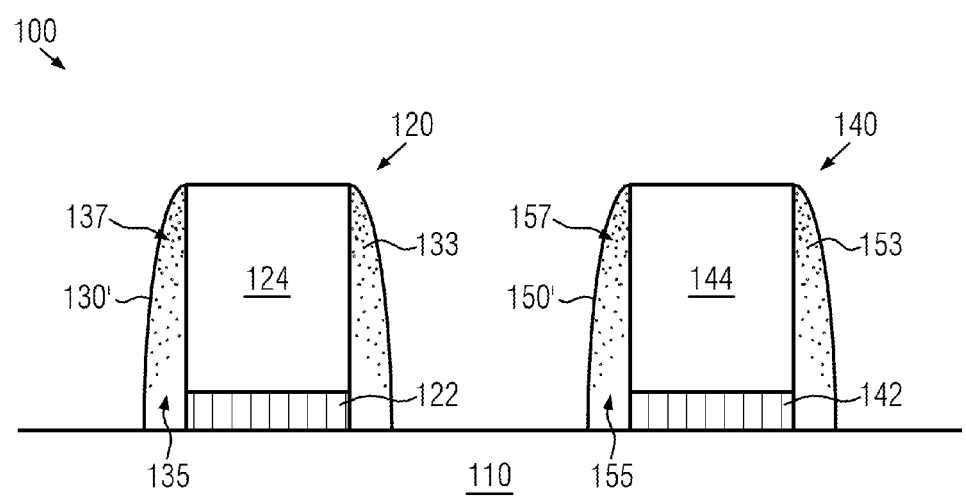

FIG. 2c schematically illustrates the semiconductor device structure 100 at a more advanced stage during fabrication, particularly after the implantation sequences 210, 220 (FIG. 2a) are performed. As schematically illustrated in FIG. 2c, a sidewall spacer 130' having implantation species (indicated by dots 133 in FIG. 2c) incorporated therein is provided. Due to shadowing as explained above with regard to FIG. 2b in the case of ray bundle 212 of the implantation sequence 210, lower portions 135 of the sidewall spacer 130' have substantially no implantation species incorporated therein. It is noted that, in some illustrative embodiments, the expression "substantially no implantation species" may be understood as having a density of implanted species smaller than 5% or preferably smaller than 1% or more preferably smaller than 0.5% of a maximum density of implanted species in the sidewall spacer 130'. An upper portion 137 disposed over the lower portion 135 has implantation species 133 incorporated therein.

Furthermore, as schematically illustrated in FIG. 2c, a sidewall spacer 150' having implantation species (indicated by dots 153) incorporated therein is provided. Due to shadowing as explained above with regard to FIG. 2b, lower portions 155 of sidewall spacer 150' having substantially no implantation species incorporated therein are present. The expression "substantially no implantation species" may be understood as having a density of implanted species smaller than 5% or preferably smaller than 1% or more preferably smaller than 0.5% of a maximum density of implanted species throughout the sidewall spacer 150'. An upper portion 157 disposed over the lower portion 155 has implantation species 153 incorporated therein.

Figure 3:
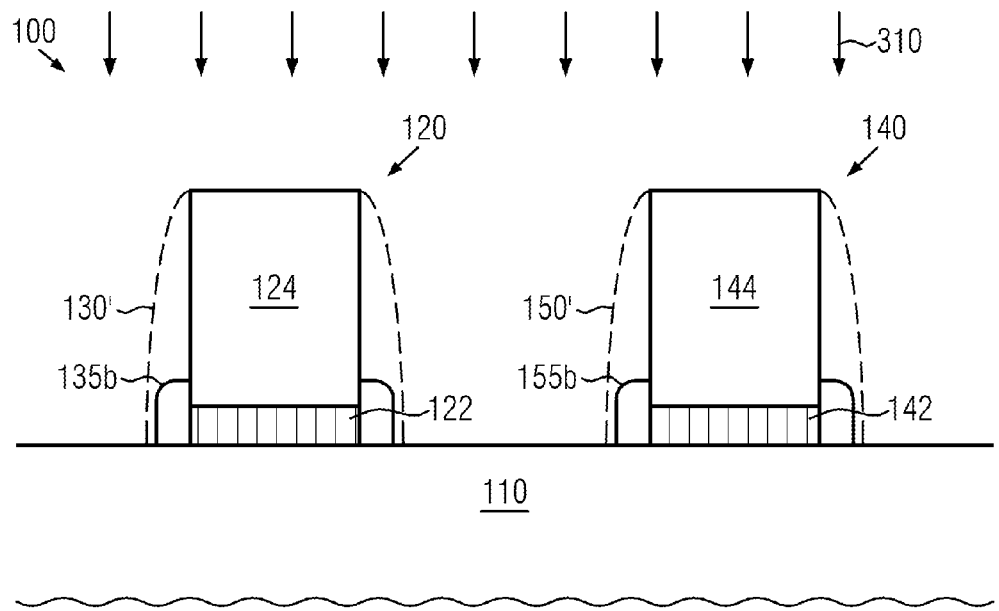

Referring to FIG. 3, the semiconductor device structure 100 is illustrated at a more advanced stage during fabrication, particularly during application of an etching process 310. The etching process 310 is applied to the semiconductor device structure 100 as illustrated in FIG. 2c so as to form shaped sidewall spacers 135b and 155b, respectively, when exposing the sidewall spacers 130' and 150', respectively, to the etching process 310. According to a special illustrative example herein, the etching process 310 may be provided by an anisotropic etching process. The person skilled in the art will appreciate that the etching process 310 is implemented such that an etch selectivity between upper portions 137 and 157, respectively, of sidewall spacers 130' and 150', respectively, shown in FIG. 2c, relative to lower portions 135 and 155, respectively, are used to substantially remove the upper portions 137 and 157 of the respective sidewall spacers 130' and 150'.

In an illustrative example, the etch rates may be modified for an hydroxide etch chemistry in case of silicon, for HF in case of oxide material and for hot $H_3PO_4$ in case of nitride material, such as SiN. In a special illustrative example herein, HF may be given by diluted HF (200:1). For example, a C implantation (6 keV, 1E16) may lead to an etch rate of SiN in hot $H_3PO_4$ (about 160° C.) of about 9 to 10 nm/min, an N implantation (7 keV, 1E16) may lead to an etch rate of SiN in hot $H_3PO_4$ of about 14 nm/min and implantation of Si (12 keV, 1E16) may result in an etch rate of about 15 nm/min, while undoped SiN has an etch rate of about 6 nm/min. On the other hand, an oxide etch rate (e.g., TEOS) in DHF (200:1) shows an etch rate (compared to initial TEOS thickness) of 13%/min for a Si implantation of 12 keV and 1E15 (energy and dosage) during an initial time interval of about 100 seconds, while undoped SiO2 has an etch rate of 10.2%/min. Increasing the dosage of Si leads to 8.03%/min (12 keV and 5E15) and 5.42%/min (12 keV and 1E16) during the initial time interval. After about 200 seconds, the etch rate of 13%/min lowered to 10.1%/min and the etch rate of 8.03%/min increased to 11.4%/min. The etch rates of undoped oxide and of highly doped (1E16) remained unchanged. These results were collected from as-implanted samples. It is concluded, that in this illustrative example, Si doping may suppress oxide etch rates in DHF solution and enhance nitride removal rates in hot $H_3PO_4$.

When observing nitride removal in another illustrative example at different Ar+dosages (0E0; 5E15; 1E16; 2E16) in processes of SiCoNi removal modified to nitride, each of the test wafers undergoing through cycles of SiCoNi removal, removal rates were observed to saturate at dosages smaller than 3E16 ions/cm² at values between 150 and 175 nm/min. Particularly, the following results were observed: 0E0: etch rate of 44.8; 5E15: etch rate of 137.0; 1E16: etch rate of 148.6; 2E16: etch rate of 156.4.

The person skilled in the art will appreciate that an appropriate implantation set up may be selected in accordance with a desired etch selectivity for obtaining shaped sidewall spacer structures as required for adjusting dimensions of source/drain extension regions relative to gate electrode structures, which will be explained in more detail below.

Figure 4:
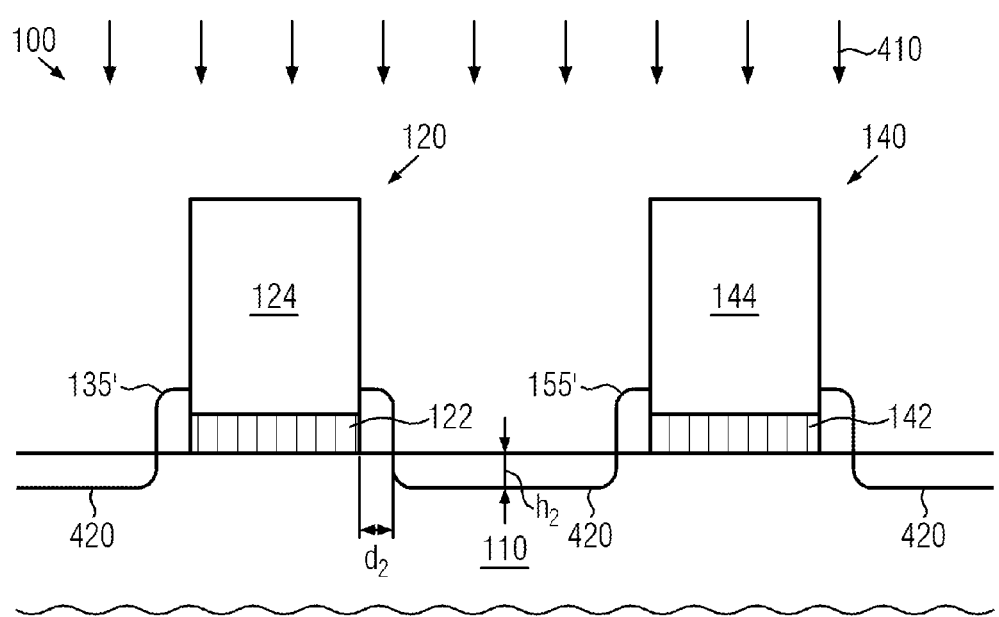

FIG. 4 schematically illustrates the semiconductor device structure 100 at a more advanced stage during fabrication, i.e., after the etching process 310 (FIG. 3) is performed. An implantation sequence 410 is performed for forming source/drain extension regions 420 within the semiconductor substrate 110 at opposing sides of the gate structures 120 and 140 in alignment with the sidewall spacers 135' and 155'. The person skilled in the art will appreciate that a distance $d_2$ of the implanted source/drain extension regions 420 to the gate structure (for example, indicated by a distance $d_2$ relative to the gate structure 120 in FIG. 4) is substantially less than a thickness $d_1$ (FIG. 2a) of the sidewall spacer 130 illustrated in FIG. 2a. In a special illustrative example herein, the distance $d_2$ may be substantially less than 50 nm or preferably less than 30 nm or more preferably less than 15 nm and even more preferably less than 10 nm. The person skilled in the art will appreciate that the distance d2 may result from the etching process 310 also laterally reducing the thickness $d_1$ (FIG. 2a) and/or the height H (FIG. 2b) to substantially a height h (FIG. 2b). Depending on the effective cross-section (effective area that governs the probability of some scattering or absorption event) of sidewall spacer-forming material used for forming the sidewall spacers 130, 150 (FIG. 2a), more dopants may be implanted into the semiconductor substrate 110 through the shaped sidewall spacers 135', 155' by means of implantation process 410 as compared to unshaped sidewall spacers (130, 150 in FIG. 2a). That is, source/drain extension regions 420 may be implanted closer to the gate structures 120 and 140.

The person skilled in the art will appreciate that in providing a reduced distance $d_2$, it is possible to reduce an implantation energy for the implantation process 410 so as to implant the source/drain extension regions 420 at a depth $h_2$ which is substantially smaller than conventional implantation depths used for conventional source/drain extension regions. The person skilled in the art will appreciate that an implantation dose used in the implantation process 410 is substantially smaller than conventionally-used implantation doses in conventional source/drain extension implantation processes. For example, the depth $h_2$ may be substantially smaller than 20 nm. As a special illustrative example herein, the depth $h_2$ may be around 10 nm. The person skilled in the art will appreciate that, in some illustrative embodiments herein, specific implant conditions could be chosen such that damage substantially occurs at the surface of target material. Accordingly, the energies employed in these illustrative embodiments may be in a range from about 2-20 keV depending on implant species.

Figure 5:
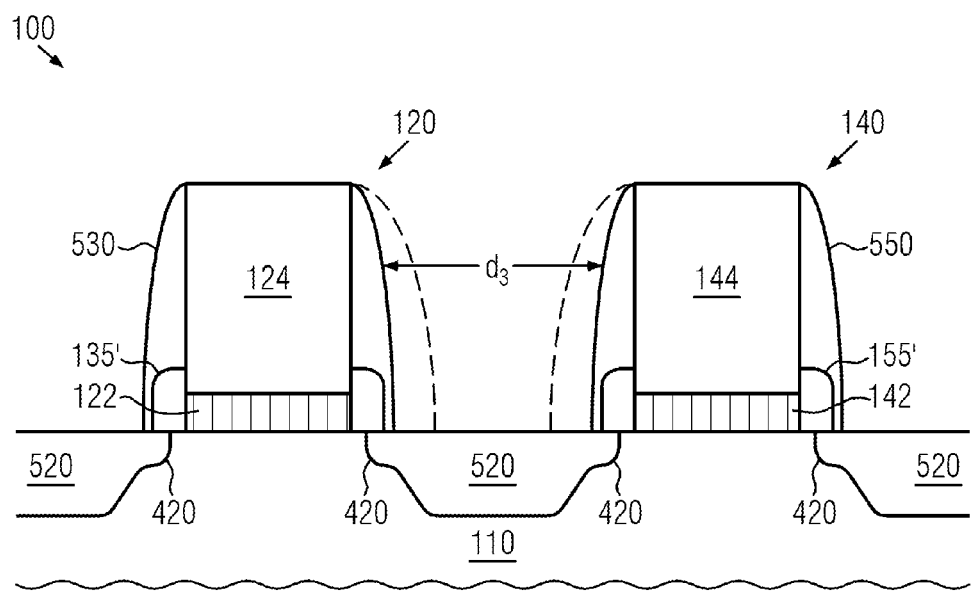

FIG. 5 illustrates the semiconductor device structure 100 at a more advanced stage during fabrication, particularly after deep source/drain regions 520 are formed within the semiconductor substrate 110 at opposing sides of the gate structures 120 and 140. The semiconductor device structure 100 as illustrated in FIG. 5 may be obtained by forming additional sidewall spacers 530 and 550 adjacent to the gate structures 120 and 140 subsequent to the formation of the source/drain extension regions 420, i.e., after the implantation process 410 illustrated in FIG. 4. The sidewall spacers 530 are formed over the shaped sidewall spacers 135' for covering the shaped sidewall spacers 135' and exposed sidewall surfaces of the gate structure 120 so as to set a distance between deep source/drain regions 520 and the gate structure 120. The sidewall spacers 550 are formed over the shaped sidewall spacers 155' for covering the shaped sidewall spacers 155' and exposed sidewall surfaces of the gate structure 140 so as to set a distance between deep source/drain regions 520 and the gate structure 140. The person skilled in the art will appreciate that, due to the shaped sidewall spacers 135' and 155', the distance between the neighboring portions of the sidewall spacers 530 and 550, indicated by double-arrow $d_3$ in FIG. 5, is greater than a distance between conventional sidewall spacers, which are indicated by the broken line in FIG. 5. Therefore, a greater distance in between sidewall spacers 530 and 550 may be obtained as opposed to conventional fabrication techniques which employ a so-called KISS etch process (not illustrated) for increasing space between neighboring gate structures 120, 140. In depositing a dielectric material (not illustrated) over the gate structures 120 and 140, and particularly filling the space between the gate structures 120, 140, i.e., increased space as indicated by $d_3$, a contact fringe capacitance may be reduced when compared to conventional fabrication techniques. It is appreciated that, in some preferred embodiments herein, a dielectric gap-filling material may be used, which material having a k-value smaller than the k-value of the sidewall spacers 530, 550. In some special illustrative examples herein, the k-value of the dielectric gap-filling material (not illustrated) may be substantially smaller than 7 (k-value of SiN) or substantially smaller than 5 (k value of $SiO_2$). In an illustrative example, a dielectric material layer is formed overlying the sidewall spacers 530, 550, said dielectric material having a k-value smaller than the k-value of at least one of the sidewall spacers 135', 155', 530, 550.

With regard to the schematic illustration of FIG. 5, it is noted that the source/drain extension regions are illustrated in a state in which they reach under the sidewall spacers 135', 155'. This is due to a clear illustration, though at this stage of illustration the source/drain extension regions 420 may be perfectly aligned to the spacers 135' and 155', as long as no diffusion of dopants has been induced to diffuse the dopants underneath of the gate structures.

The person skilled in the art will appreciate that the semiconductor device structure 100 as illustrated in FIG. 5 shows a reliable encapsulation of the gate dielectric layers 122 and 142 by means of shaped sidewall spacers 135' and 155' and sidewall spacers 530 and 550. Particularly in applications using HKMG gate stacks, the high-k material comprised of the gate dielectric layers 122, 142 and/or work function-adjusting materials comprised of the gate dielectric layers 122, 142 are reliably encapsulated. Furthermore, a sufficient distance of salicide regions (not illustrated, to be formed) is provided by an increased distance $d_3$ as compared to conventional techniques.

The person skilled in the art will appreciate that the illustrative embodiments as explained with regard to FIGS. 1-5 provide for shaped spacers having a reduced thickness, which allows for implantation of shallow extensions in ULSI semiconductor device structures as opposed to the required thick encapsulations encountered in conventional HKMG processing techniques.

The person skilled in the art will appreciate that, in some illustrative embodiments, the shaped spacers formed at the bottom of gate structures may assume a triangular or plug-like shape, depending on implantation parameters chosen for the implantation sequences 210 and 220 in FIG. 2a and etching chemistry selected for the etching process 310 in FIG. 3. The present disclosure, therefore, provides a reliable encapsulation at the bottom of gate structures which, therefore, avoids so-called TiN undercut in HKMG process techniques employing TiN work function-adjusting methods.

According to illustrative embodiments of the present disclosure, gate structures are formed and spacer deposition and etching is applied for forming spacers adjacent to the gate structures. Subsequently, a high-tilt implant with damaging species, such as, for example, xenon and/or germanium, etc., is applied, wherein neighboring gate structures shadow lower portions of the spacers of adjacent gate structures. An etching process is subsequently performed using etch rate differences for implanted versus non-implanted regions of the spacers for removing damaged areas of spacer material along upper portions of the gate stack and particularly the spacers. Consequently, lower portions of the spacers that were not exposed to the high-tilt implant of damaging species remain as shaped spacers at the bottom of gate structures.

The person skilled in the art will appreciate that, although the present disclosure is preferably applied to HKMG first processes, this does not pose any limitation on the present disclosure and the above-described process sequences may also be applied to hybrid gate processes or to so-called gate-last process techniques.

Although the present disclosure is directed to ULSI semiconductor device structures, such as device structures at technology nodes of less than 30 nm, for instance at current 28nm technology nodes, this does not pose any limitations to the present application and the above-described process sequences may be as well applied in processing at technology nodes of greater than 30 nm.

The person skilled in the art will appreciate that in order to appropriately adjust heights for shaped spacers (h in FIG. 2b), a desired shadowing may be implemented by adjusting appropriate pitch distances (P in FIG. 2b) by forming appropriate dummy gate structures and/or tuning gate structure heights (H in FIG. 2b), if required.

In aspects of the present disclosure, a reliable encapsulation of a gate dielectric is provided at very early stages during fabrication. In other aspects, a semiconductor device is provided wherein a reliable encapsulation of a gate dielectric material is maintained, the reliable encapsulation already being present at early stages during fabrication. In embodiments a semiconductor device having a plurality of gate structures is provided over a surface of a semiconductor substrate. Sidewall spacers are formed over the surface and adjacent to each of the plurality of gate structures, wherein the sidewall spacers cover sidewall surfaces of each of the plurality of gate structures. After performing an implantation sequence into the sidewall spacers using adjacent gate structures as implantations masks shadowing lower portions of the sidewall spacers, an etching process is performed for removing implanted portions from the sidewall spacers, leaving lower shadowed portions of the sidewall spacer as shaped sidewall spacers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention.

Accordingly, the protection sought herein is as set forth in the claims below.

What is claimed:

1. A method of forming a semiconductor device, comprising:
   providing a plurality of gate structures over a surface of a semiconductor substrate;
   forming sidewall spacers over said surface and adjacent to each of said plurality of gate structures, said sidewall spacers covering sidewall surfaces of each of said plurality of gate structures;
   performing an implantation sequence into said sidewall spacers so as to form implanted portions in said sidewall spacers; and
   subsequently performing an etching process for removing said implanted portions from said sidewall spacers so as to form shaped sidewall spacers.

2. The method of claim 1, wherein at least a subset of said plurality of gate structures comprises gate stacks, each of said gate stacks having a gate dielectric and a gate electrode material disposed over said gate dielectric.

3. The method of claim 2, wherein said gate dielectric material comprises a high-k dielectric material.

4. The method of claim 1, wherein said implantation sequence comprises a first implantation step applied at a first tilt angle relative to a normal direction of said surface and a second implantation step applied at a second tilt angle relative to a normal direction of said surface, wherein said first and second tilt angles are different from each other and each of said first and second tilt angles is different from zero degrees.

5. The method of claim 4, wherein the absolute value of a difference between absolute values of said first tilt angle and said second tilt angle is substantially less than five degrees.

6. The method of claim 1, wherein said implantation sequence comprises at least one implantation process for implanting one of xenon, germanium and the like, wherein said at least one implantation process is applied at a tilt angle relative to a normal of said surface, said tilt angle being substantially greater than about 15 degrees.

7. The method of claim 6, wherein said tilt angle is greater than about 30 degrees.

8. The method of claim 1, wherein the method further comprises forming source/drain extension regions in alignment with said shaped sidewall spacers at two opposing sides of each of said plurality of gate structures.

9. The method of claim 8, wherein the method further comprises forming another spacer structure adjacent to each of said plurality of gate structures, said other spacer structure covering said shaped sidewall spacers and sidewall portions of each of said plurality of gate structures which sidewall portions were exposed during said etching process.

10. The method of claim 9, wherein the method further comprises forming a dielectric layer on said another spacer structure directly after forming said another spacer structure, said dielectric layer having a k-value smaller than the k-value of said another spacer structure.

11. The method of claim 8, wherein forming said source/drain extension regions comprises an extension region implantation sequence using implantation energies substantially smaller than 30 keV.

12. A method of forming a semiconductor device, comprising:
   providing at least a first gate structure and a second gate structure over a surface of a semiconductor substrate;
   forming at least a first sidewall spacer over said surface and adjacent to said first gate structure and a second sidewall spacer over said surface and adjacent to said second gate structure, said at least first and second sidewall spacers covering sidewall surfaces of each of said first and second gate structures;
   performing a first implantation sequence into said at least first and second sidewall spacers so as to form implanted portions in said at least first and second sidewall spacers;
   performing an etching process for removing said implanted portions from said at least first and second sidewall spacers for forming at least first and second shaped sidewall spacers;
   performing a second implantation sequence for forming source and drain extension regions adjacent to each of said at least first and second gate structures in alignment with said shaped sidewall spacers;
   forming at least a third sidewall spacer over said first sidewall spacer and a fourth sidewall spacer over said second sidewall spacer; and
   performing a third implantation process for forming deep source and drain regions at two opposing sides of at least said first and second gate structures within said source and drain extension regions in alignment with said third and fourth sidewall spacers.

13. The method of claim 12, wherein said first implantation sequence comprises at least one implantation process for implanting one of xenon, germanium and the like, wherein said at least one implantation process is applied at a tilt angle relative to a normal of said surface, said tilt angle being substantially greater than about 15 degrees.

14. The method of claim 12, wherein forming said second implantation sequence is performed with implantation energies substantially smaller than 30 keV.

* * * * *